(12) United States Patent
Komatsu

(10) Patent No.: US 6,773,970 B2
(45) Date of Patent: Aug. 10, 2004

(54) METHOD OF PRODUCING A SEMICONDUCTOR DEVICE HAVING IMPROVED GATE STRUCTURE

(75) Inventor: Hiroshi Komatsu, Kanagawa (JP)

(73) Assignee: SonyCorporation, Tokyo (JP)

( * ) Notice: Subject to any disclaimer, the term of this patent is extended or adjusted under 35 U.S.C. 154(b) by 0 days.

(21) Appl. No.: 10/368,994

(22) Filed: Feb. 19, 2003

(65) Prior Publication Data

US 2003/0181015 A1 Sep. 25, 2003

(30) Foreign Application Priority Data

Feb. 22, 2002 (JP) ........................................ 2002-046393

(51) Int. Cl.[7] .......................... H01L 21/00; H01L 21/84
(52) U.S. Cl. ....................... 438/149; 438/180; 438/184; 438/195
(58) Field of Search ................................ 438/149, 180, 438/184, 195

(56) References Cited

U.S. PATENT DOCUMENTS 6,200,840 B1 * 3/2001 Chen et al. .................. 438/184
6,465,847 B1 * 10/2002 Krishnan et al. ........... 257/347
6,576,963 B2 * 6/2003 Jin et al. ..................... 257/388

* cited by examiner

Primary Examiner—Hsien Ming Lee
(74) Attorney, Agent, or Firm—Robert J. Depke; Holland & Knight LLP

(57) ABSTRACT

A method of producing a semiconductor device able to prevent outward diffusion of an impurity from a gate electrode and improve the device quality, the method comprising the steps of forming a gate electrode made of a semiconductor layer on a substrate (preferably SOI substrate) via a gate insulating film, forming a first insulating film coating the gate electrode by ALD, forming a second insulating film on a first insulating film, introducing an impurity to a substrate (preferably silicon active layer of the SOI wafer) to form a source/drain region by self-alignment with respect to the gate electrode, and forming an interlayer insulating film on the second insulating film.

4 Claims, 7 Drawing Sheets

METHOD OF PRODUCING A SEMICONDUCTOR DEVICE HAVING IMPROVED GATE STRUCTURE

This application claims priority to Japanese Patent Application Number JP2002-046393 filed Feb 22, 2002, which is incorporated herein by reference.

BACKGROUND OF THE INVENTION

1. Field of the Invention

The present invention relates to a method of producing a semiconductor device, more particularly relates to a method of producing a semiconductor device having a gate electrode doped with an impurity at a high concentration.

2. Description of the Related Art

Due to the increased miniaturization of semiconductor chips, the degree of integration has been doubling every three years according to the scaling rule. Along with this, faster speeds and lower consumption of energy have been achieved. The transistors of semiconductor chips are being miniaturized by reduction of the size of the electrodes and reduction of the thickness of gate insulating films.

Transistors can be also miniaturized by controlling precisely the impurity profile of a channel formation region of the transistor or its vicinity to form a shallow junction. Miniaturization of transistors enables improvement of the drive capability of transistors and decrease of the parasitic capacitance etc.

Up to now, polysilicon doped with an impurity at a high concentration has been often used as an gate electrode. FIG. 1 is a cross-sectional view of a gate electrode made of doped polysilicon. As shown in FIG. 1, a silicon wafer 21 is separated into element formation regions by element isolation regions 22. A gate electrode 24 is formed on an element formation region of the silicon wafer 21 via a gate insulating film 23. For example, a silicon oxide film is formed above the gate electrode 24 and the silicon substrate 21 as an interlayer insulating film 25.

FIG. 2 is an enlarged view of a part of the gate electrode 24 of FIG. 1. Various types of heat treatment are conducted during the process for formation of a semiconductor chip. For example, when using $p^+$-type polysilicon doped with boron (B) as the gate electrode 24, depending on the conditions of heat treatment conducted after doping the boron into the gate electrode 24, the boron in the gate electrode 24 will precipitate on the silicon oxide film of the interlayer insulating film 25 etc. (boron precipitation part 26) and the boron will diffuse in the silicon oxide film at a relatively high speed (boron diffusion path 27).

When an impurity diffuses from the gate electrode 24 to the interlayer insulating film 25 along with heat treatment, the part of the gate electrode 24 near the interface with the interlayer insulating film 25 becomes depleted. Due to this, the drive capability of the transistor is lowered and/or the work function (threshold of transistor) fluctuates.

Along with miniaturization of the gate electrodes, the problem described above of the outward diffusion of the impurity in the doped polysilicon gate electrode tends to become more prominent. When miniaturizing a gate electrode, the aspect ratio of the gate electrode increases. Due to this, the amount of diffusion of the impurity in the gate electrode from the side surfaces of the gate electrode to the insulating film increases. As a result, it becomes more difficult to prevent deterioration and/or fluctuation of the device performance.

The diffusion of the impurity from the side surfaces of the gate electrode is observed not only in the case of using a single layer of $p^+$-type polysilicon as the gate electrode, but also in a gate electrode of polycide structure wherein a refractory (heat resistant) metal silicide layer is formed on $p^+$-type polysilicon or in a gate electrode of a polymetal structure wherein a refractory metal or other metal layer is formed on $p^+$-type polysilicon via a barrier metal.

Although the silicon oxide films are represented by the same composition ($SiO_2$), the diffusion coefficient of boron is generally larger in the interlayer insulating film than in the gate oxide film. Therefore, the concentration of boron in the $p^+$-type polysilicon gate electrode is apt to decrease particularly at the vicinity of the interface with the silicon oxide film of the interlayer insulating film.

In this case, the polysilicon at the vicinity of the surface or side surfaces of the gate electrode becomes depleted and the work function of $p^+$-polysilicon fluctuates locally. Due to this, in a transistor using $p^+$-type polysilicon as a gate electrode, the fluctuation of various characteristics, commencing with the threshold Vth, increases.

On the other hand, in the case of $n^+$-type polysilicon gate electrodes doped with phosphorous (P), the phosphorous atoms in the gate electrode pile up at the interface with the silicon oxide film. Therefore, in this case too, the concentration of the impurity in the polysilicon decreases at the vicinity of the interface of the polysilicon and the silicon oxide film.

Of the above, the amount of the impurity leaking from the side surfaces of the gate electrode particularly changes depending on the gate length Lg and gate width Wg of each pattern of gate electrodes. Therefore, it cannot be controlled equally over the entire LSI. The amount of an impurity leaking from a gate electrode relatively increases along with miniaturization of the gate electrode. Particularly, when the gate length is 0.1 μm or less, depletion of the gate electrode due to escape of an impurity becomes predominant. Therefore, the drive capability of current of a transistor does not improve even if the gate electrode is miniaturized (see Murakami et al., Technical Report of IEICE Information and Communication Engineers SDM 2001-48, pp. 25.)

Japanese Unexamined Patent Publication (Kokai) No. 10-303410 proposes, as a method of prevention of outward diffusion of an impurity in a gate electrode, a method of covering the entire gate electrode with a capping layer. FIG. 3 shows the structure of a gate electrode disclosed in the publication.

The structure of FIG. 3 is one wherein a silicon nitride film 28 ($Si_3N_4$ film) and side wall spacer 29 made of a silicon nitride film are provided as a capping layer. The silicon nitride film 28 and side wall spacer 29 are formed by low-pressure chemical vapor deposition (LP-CVD) or another method. According to this method, diffusion of an impurity from the top surface and side surfaces of a gate electrode can be prevented effectively.

However, according to the structure and method disclosed in the above Japanese Unexamined Patent Publication (Kokai) No. 10-303410, since the entire gate electrode is capped with a relatively thick silicon nitride film, the following problems arise. These make it difficult to apply this technique for all miniaturized devices of the next generation.

When capping a gate electrode with a relatively thick silicon nitride film, the stress of the silicon nitride film increases relatively along with miniaturization of the gate electrode. Due to the stress, depending on the circumstances, the gate electrode may peel off, the energy level of the interface with the gate insulating film may increase, or other phenomena may arise.

Also, to cap a gate electrode with a silicon nitride film, it is necessary to form a silicon nitride film over the entire surface, then remove part of the silicon nitride film by dry etching leaving only the silicon nitride film covering the gate electrode. This etching is performed anisotropically using the base silicon substrate as a stopper.

Since the etch selectivity of silicon nitride with respect to silicon is difficult to increase in principle, it is impossible to completely prevent etching of the base silicon while etching the silicon nitride film.

In recent years, as a transistor able to drastically decrease the junction capacitance, a transistor of an SOI structure has been produced. When forming the gate electrode described in Japanese Unexamined Patent Publication (Kokai) No. 10-303410 on an SOI having a thin silicon active layer, during a dry etching step of the silicon nitride film to process the capping layer, the base thin silicon active layer disappears or is etched in an unallowable amount. Therefore, the above described conventional method is difficult to apply to a device of a SOI structure.

Further, according to the structure and method described in Japanese Unexamined Patent Publication (Kokai) No. 10-303410, since the side surfaces of the gate electrode are completely covered by the silicon nitride film, the effective dielectric constant between the gate electrode and the impurity diffusion layer increases. As a result, the parasitic capacitance caused by a fringe capacitance between the gate electrode and the impurity diffusion layer increases.

SUMMARY OF THE INVENTION

An object of the present invention is to provide a method of producing a semiconductor device able to lower the stress of the insulating film covering the gate electrode, prevent outward diffusion of an impurity from the gate electrode, prevent consumption of the base semiconductor layer, and improve the device quality.

According to the present invention, there is provided a method of producing a semiconductor device comprising the steps of forming a gate insulating film on a substrate, forming a semiconductor layer or a conductive layer on the gate insulating film, diffusing an impurity in the semiconductor layer, processing the semiconductor layer or the conductive layer by etching to form a gate electrode of a predetermined pattern, forming a first insulating film covering a top surface and side surfaces of the gate electrode by a deposition method, preferably atomic layer deposition (ALD), controlling a film thickness at an atomic layer level, forming a second insulating film on the first insulating film, introducing an impurity in the substrate via the first and second insulating film to form a source/drain region by self-alignment with respect to the gate electrode, and forming an interlayer insulating film on the second insulating film for eliminating unevenness between the gate electrode and the substrate.

Preferably, an extension of the source/drain region is formed in the step of forming the source/drain region after forming the second insulating film. In this case, the method preferably further comprises the steps of forming a third insulating film on the second insulating film after forming the extension, etching back the third insulating film so as to leave the third insulating film only on side surfaces of the gate electrode to form a gate side wall spacer made of the third insulating film, and introducing an impurity in the substrate via the first and second insulating films to form the source/drain region by self-alignment with respect to the gate side wall spacer.

Preferably, a silicon-containing layer is formed as the semiconductor layer. In this case, the method further comprises the steps of removing the first and second insulating films on the source/drain region and on the gate electrode after forming the source/drain region and forming a metal silicide layer on the source/drain region and on the gate electrode. Preferably, as the substrate, an SOI (silicon on insulator or semiconductor on insulator) substrate comprised of a silicon substrate formed with a silicon active layer via a silicon oxide film is used and the source/drain region is formed in the silicon active layer.

Due to this, it becomes possible to decrease the influence of stress of the insulating film on the gate electrode and prevent outward diffusion of an impurity from the gate electrode to the interlayer insulating film. According to the ALD method, it is possible to control the thickness at an atomic layer level or molecular layer level and form an extremely thin insulating film of for example a layer of about two molecules thickness. Therefore, when forming for example a silicon nitride film by the ALD method on the surface of the gate electrode, the influence of stress of the silicon nitride film can be decreased compared with the case of forming a silicon nitride film by CVD or another method.

Also, when forming the gate side wall spacer in the present invention, the second insulating film becomes an etching stopper layer during etching of the third insulating film. Due to using a film having a sufficiently small etch selectivity with respect to the third insulating film as the second insulating film, damage of the semiconductor substrate or other base is prevented. Therefore, the present invention is particularly preferable for a transistor of an SOI structure wherein the source/drain region is formed in a thin silicon active layer.

BRIEF DESCRIPTION OF THE DRAWINGS

The above and other objects and features of the present invention will be apparent more in detail with reference to the accompanying drawings, in which.

DESCRIPTION OF THE PREFERRED EMBODIMENTS

Below, a preferred embodiment of the method of producing a semiconductor device of the present invention will be described with reference to the accompanying drawings. FIGS. 4A to 4H are cross-sectional views of steps of a method of producing a semiconductor device of the present embodiment. The present embodiment shows steps of production of an n-channel type MOS (nMOS) transistor.

Figure 1:
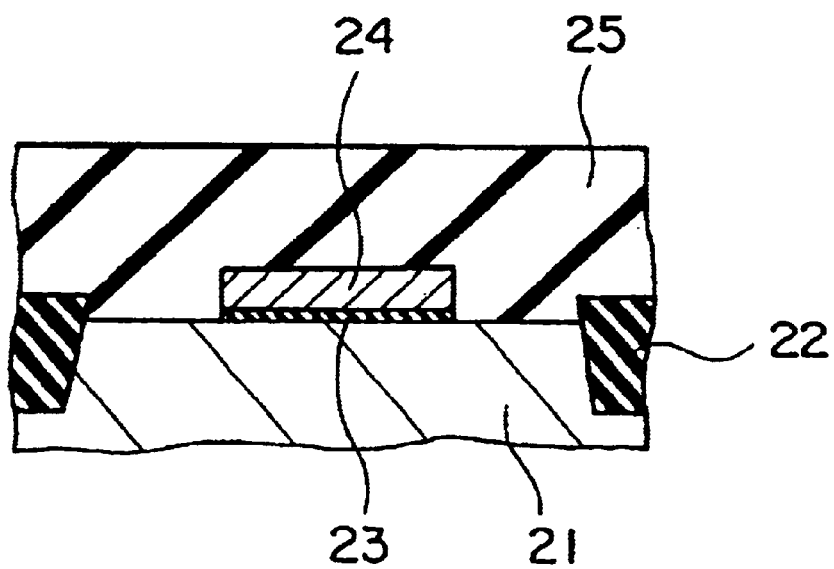
FIG. 1 is a cross-sectional view of a conventional semiconductor device.
Figure 2:
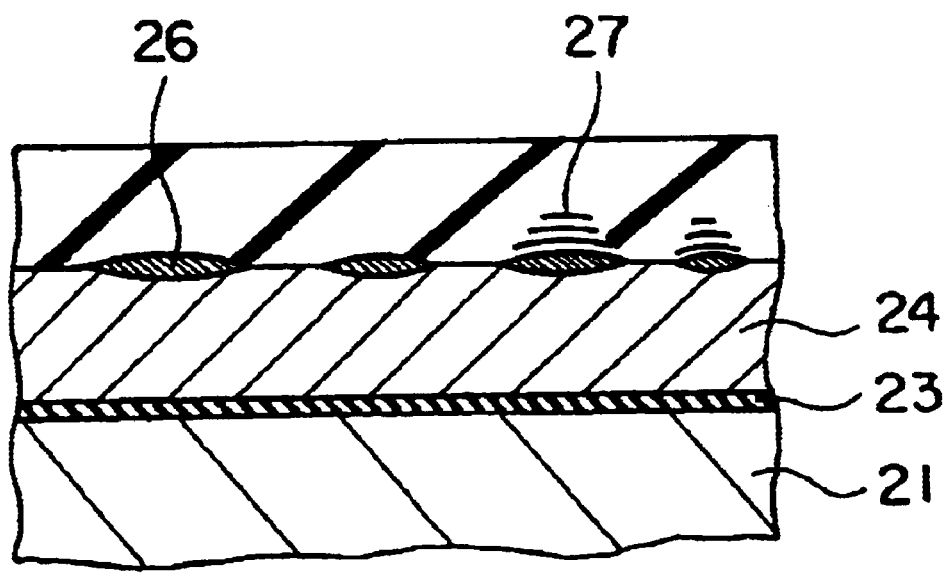
FIG. 2 is an enlarged view of a gate electrode part of FIG. 1 showing outward diffusion of an impurity due to heat treatment.
Figure 3:
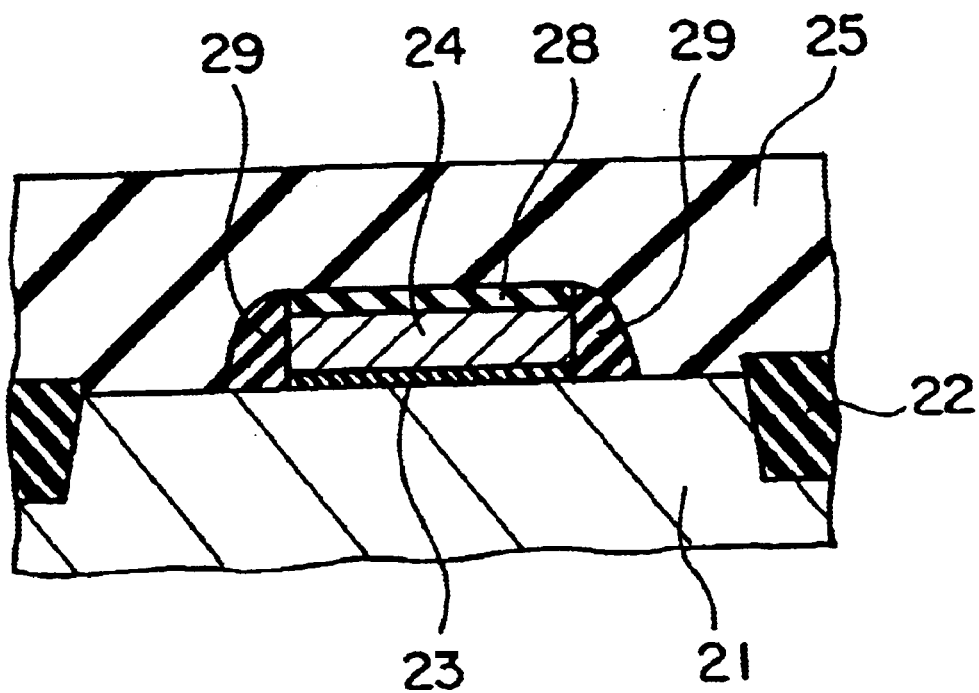
FIG. 3 is a cross-sectional view of a conventional semiconductor device.
Figure 4A:
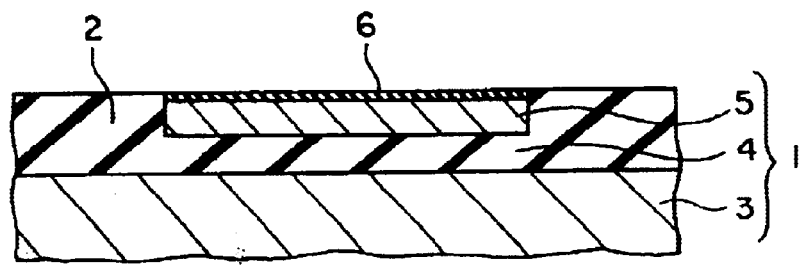
FIGS. 4A to 4H are cross-sectional views of steps of a method of producing a semiconductor device of the present invention.

First, as shown in FIG. 4A, an element isolation region 2 is formed in an SOI substrate 1. The SOI substrate 1 is comprised of a silicon substrate 3 formed via a buried oxide film 4 with a silicon active layer 5 and is made by a known method such as separation by implanted oxygen (SIMOX).

According to the SIMOX method, a silicon active layer 5 having a thickness of 50 nm or less, for example, about 42 nm, can be formed without fluctuation in thickness.

The element isolation region 2 is formed by for example shallow trench isolation (STI). In the STI method, a groove (trench) reaching the buried oxide film 4 is formed in the silicon active layer 5 and a silicon oxide film is deposited over the entire surface including in the groove by CVD. After this, chemical mechanical polishing (CMP) is conducted to leave the silicon oxide film only in the groove and to remove the silicon oxide film on the silicon active layer 5. Alternatively, it is also possible to form the element isolation region 2 in the silicon active layer 5 by local oxidation of silicon (LOCOS). On the surface of the silicon active layer 5, a gate oxide film 6 is formed by for example thermal oxidation.

Figure 4B:
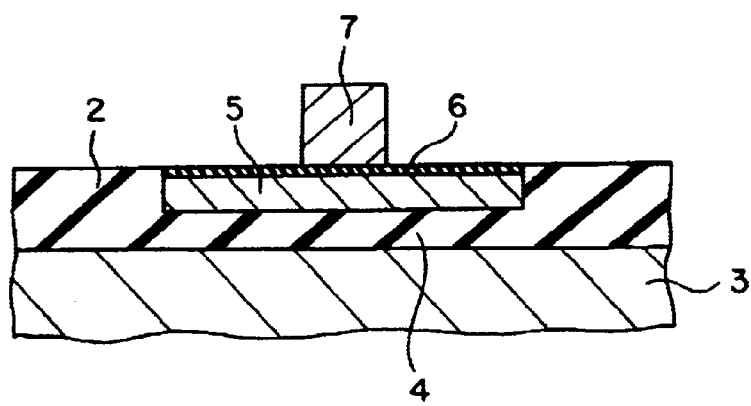

Next, as shown in FIG. 4B, a gate electrode 7 is formed on the gate oxide film 6. For forming the gate electrode 7, first, a polysilicon film is formed by CVD over the entire surface at a thickness of for example 150 nm. Phosphorous (P) is ion-implanted in the polysilicon film as an n-type impurity, then a resist is formed on the polysilicon film in a pattern of the gate electrode by lithography.

The polysilicon film is then dry etched using the resist as a mask to form the gate electrode 7. The dry etching is conducted using for example an electron cyclotron resonance (ECR) type etching system. The etching conditions are set as for example a microwave output of 400W, a radio frequency output of 25W, an HBr gas flow of 95 sccm, a $Cl_2$ gas flow of 15 sccm, a temperature of 20° C., and a pressure of 0.5 Pa.

Figure 4C:
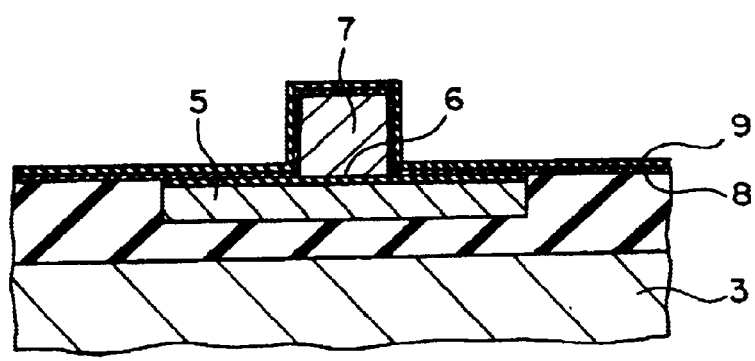

Next, as shown in FIG. 4C, a silicon nitride film 8 is deposited by the ALD method at a thickness of for example 0.4 nm (about a layer of two molecules). In this ALD, $SiCl_4$ is supplied for 30 seconds at 375° C. (exposure) and then the gas is evacuated for 60seconds. Next, $NH_3$ is supplied for 30 seconds at 550° C. and then the gas is evacuated for 60 seconds. The above described supply and evacuation of $SiCl_4$ and supply and evacuation of $NH_3$ are treated together as 1 cycle. This cycle is repeated five times.

Further, a thin silicon nitride film 9 for preventing channeling is deposited on the silicon nitride film 8 at a thickness of for example 10 nm. The silicon nitride film 9 can be formed by CVD using for example tetraethyl orthosilicate (TEOS) as a source in the same manner as a conventional oxide film for prevention of channeling.

Figure 4D:
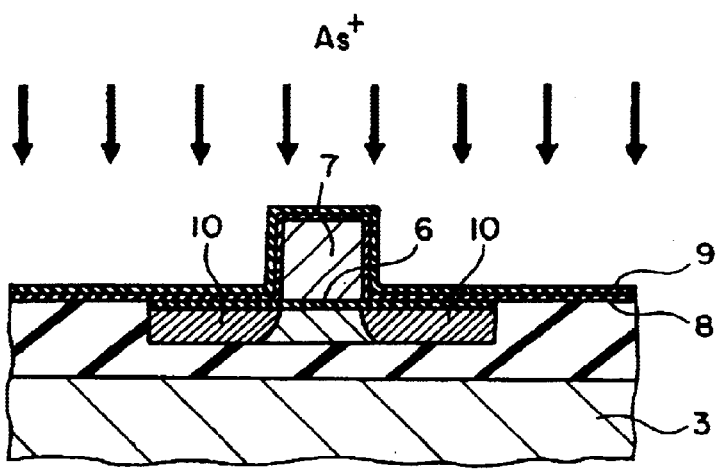

Next, as shown in FIG. 4D, an n-type impurity is ion-implanted in the gate electrode 7 by self-alignment. Due to this, an extension 10 of the source/drain is formed. The conditions of the ion-implantation are set as for example an ion species of the n-type impurity of $As^+$, an acceleration voltage of 2.5 keV, a dose of $1.8 \times 10^{15}$ atoms/cm$^2$, and an implantation angle of 0°.

Figure 4E:
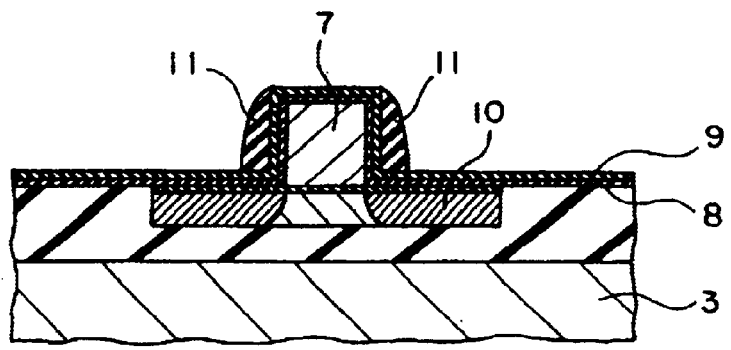

Next, as shown in FIG. 4E, a gate side wall spacer 11 is formed on the side surfaces of the gate electrode 7 via the silicon nitride film 8 and the silicon oxide film 9. The gate side wall spacer 11 is formed by depositing a silicon nitride film over the entire surface, then etching it back by an anisotropic process. In the etching back the silicon nitride film, the silicon oxide film 9 serves as an etching stopper layer to prevent damage of the base due to etching.

The silicon nitride film is deposited by using a for example vertical CVD system under the conditions of a temperature of 760° C., a pressure of 53 Pa, a $SiH_2Cl_2$ gas flow of 90 sccm, an $NH_3$ gas flow of 600 sccm, and a $N_2$ gas flow of 500 sccm.

For etching back the silicon nitride film, for example, a magnetron type etching system is used. The etching conditions are set at a radio frequency output of 1000W, a $CHF_3$ gas flow of 45 sccm, a temperature of 20° C., and a pressure of 2.7 Pa.

Figure 4F:
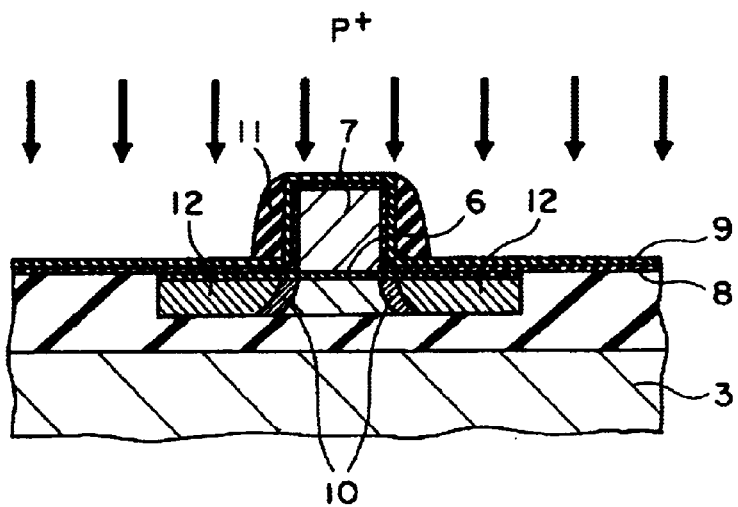

Next, as shown in FIG. 4F, for example phosphorous (P) is ion-implanted as an n-type impurity in the gate side wall spacer 11 by self-alignment. Due to this, a source/drain region 12 is formed.

Next, heat treatment is performed to diffuse the impurity introduced in the gate electrode 7, extension 10, and source/drain region 12 and to activate these parts. This heat treatment is made a rapid thermal annealing (RTA) process of for example 1000° C. for 10 seconds in a $N_2$ gas atmosphere.

After the heat treatment, the silicon oxide film 9 on the gate electrode 7 and the source/drain region 12 is removed by wet etching using hydrofluoric acid. The silicon nitride film 8 on the gate electrode 7 and the source/drain region 12 can be removed by wet etching using hydrofluoric acid since it is a very thin film formed by ALD. When suppressing etching of the silicon oxide film and removing selectively the silicon nitride film 8, for example wet etching using phosphoric acid is conducted.

Figure 4G:
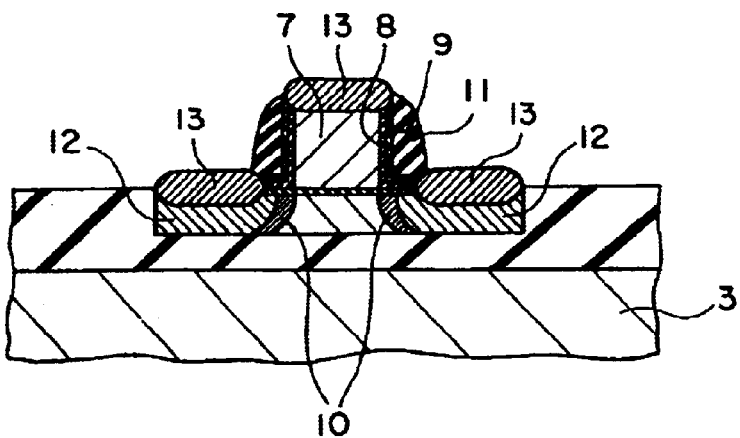

Next, as shown in FIG. 4G, for example a cobalt silicide layer ($CoSi_2$ layer) 13 is formed as a refractory metal silicide layer on the gate electrode 7 and the source/drain region 12 by self-alignment. The cobalt silicide layer 13 is formed by forming a cobalt layer by sputtering over the entire surface and then reacting it with the polysilicon of the gate electrode or the silicon of the source/drain region 12 due to heat treatment. After this, the non-reacted cobalt layer is removed.

Figure 4H:
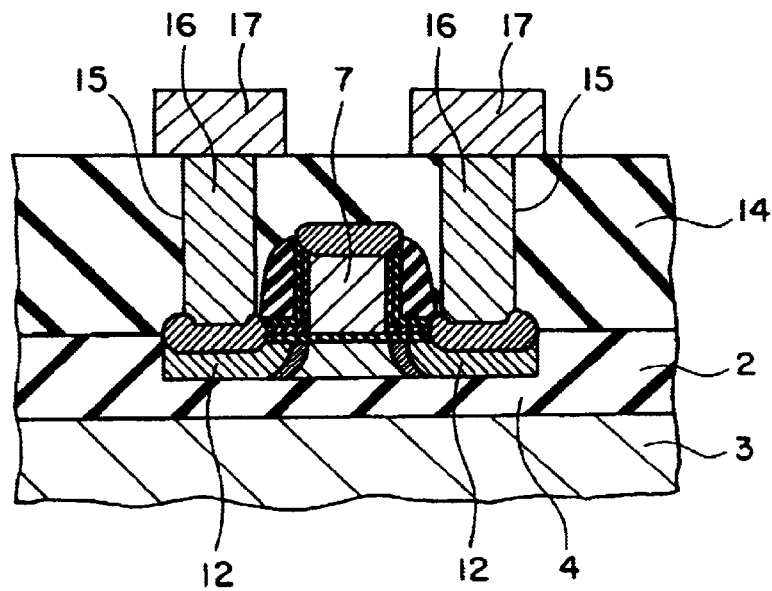

Next, as shown in FIG. 4H, a for example silicon oxide film is formed as an interlayer insulating film 14 over the entire surface by CVD. A contact hole 15 is formed in the interlayer insulating film 14 on the source/drain region 12. In the contact hole 15, a plug 16 made of a metal such as tungsten, is formed. After this, an interconnection 17 is formed on the interlayer insulating film 14 so as to connect the plug 16. Due to the above steps, the nMOS is formed.

According to the method of producing a semiconductor device of the embodiment of the present invention, after coating the gate electrode with an extremely thin ALD film (the silicon nitride film 8), the thin silicon oxide film 9 for prevention of channeling is formed. Due to this, the outward diffusion of an impurity from the gate electrode is suppressed. Also, local decrease of an impurity concentration of the gate electrode 7 at the vicinity of the interface between the gate electrode 7 and the interlayer insulating film 14 is prevented.

Also, compared with the case of forming a relatively thick silicon nitride film as a capping layer of the gate electrode by CVD, that is, the conventional method, it is possible to decrease drastically the influence of stress of the silicon nitride film on the gate electrode. Therefore, even if the gate electrode is miniaturized, the device quality can be improved according to the scaling rule.

The embodiments of the method of producing a semiconductor device of the present invention are not limited to the above explanations. Although the silicon nitride film 8 is formed by ALD in the above embodiment, it is also possible to form other insulating films than a silicon nitride film, for example, to form a silicon oxynitride film (SiON film) by ALD. Alternatively, it is also possible to form a multilayer film of a for example silicon oxide film and a silicon nitride film or other insulating film of a multilayer structure by ALD.

Also, the cobalt silicide layer 13 can be changed to a tungsten silicide layer, titanium silicide layer, or other refractory metal silicide layer. While the cobalt silicide layer 13 is formed on the polysilicon film and a polycide gate electrode of a two-layer structure is formed in the above embodiment, it is also possible to form a gate electrode of a single layer of tungsten silicide or another silicide.

Alternatively, it is possible to form a gate electrode of a polymetal structure wherein a tungsten or other metal layer is formed on a polysilicon film via a barrier metal. When coating the gate electrode of such a structure with an ALD film (silicon nitride film) too, the outward diffusion of an impurity from the gate electrode is prevented.

While a transistor is formed on an SOI substrate in the above embodiment, it is also possible to apply the present invention to a device formed on a bulk silicon substrate. Further, while an example of forming an nMOS is shown in the above embodiment, the present invention can be also applied to a pMOS.

If a p-type impurity is introduced to a pMOS formation region and an n-type impurity is separately introduced to an nMOS formation region using a resist as a mask in a step of ion-implantation of an impurity to a polysilicon film becoming a gate electrode, it is possible to apply the present invention to forming a CMOS.

Summarizing the effects of the invention, according to a method of producing a semiconductor device of the present invention, it is possible to lower the stress of an insulating film coating a gate electrode, suppress outward diffusion of an impurity from the gate electrode, prevent consumption of a base semiconductor or conductive layer, and improve the device quality.

Note that the present invention is not limited to the above embodiments and includes various modifications within the scope of the claims.

What is claimed is:

1. A method of producing a semiconductor device comprising the steps of:

forming a gate insulating film as a layer secured to a substrate;

forming a gate electrode material layer above the gate insulating film;

processing the gate electrode material layer by etching to form a gate electrode;

diffusing an impurity into the gate electrode material layer;

forming a first insulating film covering a top surface and side surfaces of the gate electrode by a deposition method that controls a film thickness at an atomic layer level;

forming a second insulating film over the first insulating film;

forming a third insulating film on the second insulating film;

etching the third insulating film so as to leave the third insulating film only adjacent the side surfaces of the gate electrode to form a gate side wall spacer made of the third insulating film;

introducing an impurity through the first and second insulating films to form source/drain regions by self-alignment with respect to the gate side wall spacer; and removing the first and second insulating films on the source/drain regions and on the gate electrode via a wet etching process.

2. A method of producing a semiconductor device as set forth in claim 1, said method further comprising the step of:

forming a metal silicide layer on the source/drain regions and on the gate electrode.

3. A method of producing a semiconductor device as set forth in claim 2, using an SOI (silicon on insulator or semiconductor on insulator) substrate wherein a silicon active layer is formed over a silicon substrate on a silicon oxide film and forming the source/drain regions in the silicon active layer.

4. A method of producing a semiconductor device as set forth in claim 1, using an SOI (silicon on insulator or semiconductor on insulator) substrate wherein a silicon active layer is formed over a silicon substrate on a silicon oxide film and forming the source/drain regions in the silicon active layer.

* * * * *